United States Patent [19]

Takahashi et al.

[11] Patent Number: 4,707,695
[45] Date of Patent: Nov. 17, 1987

[54] MAGNETIC POSITION SENSOR

[75] Inventors: Tadashi Takahashi; Kunio Miyashita; Syooichi Kawamata, all of Hitachi, Japan

[73] Assignee: Hitachi, Ltd., Tokyo, Japan

[21] Appl. No.: 510,914

[22] Filed: Jul. 5, 1983

[30] Foreign Application Priority Data

Jul. 2, 1982 [JP] Japan ............................ 57-113928

[51] Int. Cl.⁴ .......................................... G08C 19/06
[52] U.S. Cl. ............................ 340/870.31; 324/208; 324/252
[58] Field of Search ...................... 340/870.31, 870.32, 340/870.33, 870.35; 324/207, 208, 234, 235, 252, 260, 262; 338/32 R; 360/113

[56] References Cited

U.S. PATENT DOCUMENTS

| | | | |
|---|---|---|---|
| 2,536,805 | 1/1951 | Hansen | 340/870.31 |
| 3,293,636 | 12/1966 | Dunne | 340/870.32 |
| 3,810,136 | 5/1974 | Lang et al. | 340/870.35 |
| 3,949,345 | 4/1976 | Makino et al. | 338/32 R |
| 3,949,346 | 4/1976 | Makino et al. | 338/32 R |
| 3,993,946 | 11/1976 | Makino | 324/32 R |
| 4,257,040 | 3/1981 | Shirasaki et al. | 340/870.31 |
| 4,274,053 | 6/1981 | Ito et al. | 324/208 |
| 4,429,276 | 1/1984 | Narimatsu et al. | 324/207 |
| 4,490,674 | 12/1984 | Ito | 324/208 |
| 4,492,922 | 1/1985 | Ohkubo | 324/207 |
| 4,551,676 | 11/1985 | Amemiya et al. | 324/208 |

FOREIGN PATENT DOCUMENTS

| | | | |
|---|---|---|---|
| 225037 | 1/1968 | U.S.S.R. | 340/870.31 |
| 0589541 | 1/1978 | U.S.S.R. | 340/870.31 |

Primary Examiner—John W. Caldwell, Sr.
Assistant Examiner—Mahmoud Fatahi-yar
Attorney, Agent, or Firm—Antonelli, Terry & Wands

[57] ABSTRACT

In a magnetic detector for receiving a reference position signal in movement from an encoder track and a reference track arranged on a member included in a magnetic position sensor, magnetic pickups respectively confronting to the encoder track and the reference track are provided and both tracks jointly yield a position reference signal.

20 Claims, 18 Drawing Figures

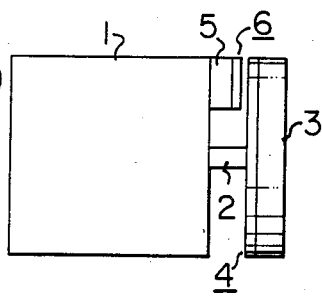
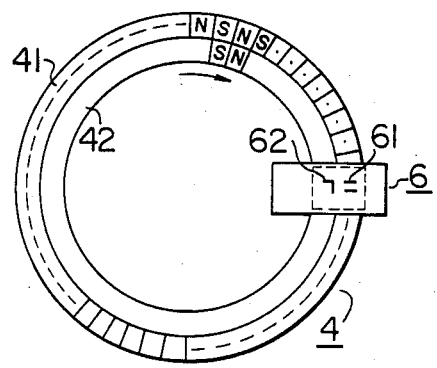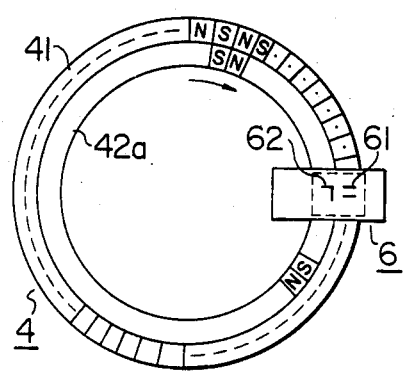
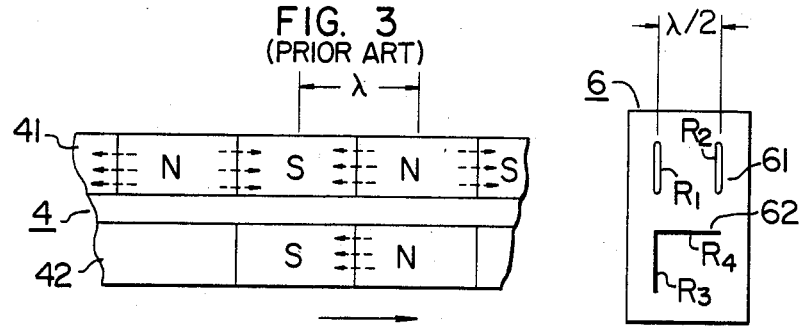

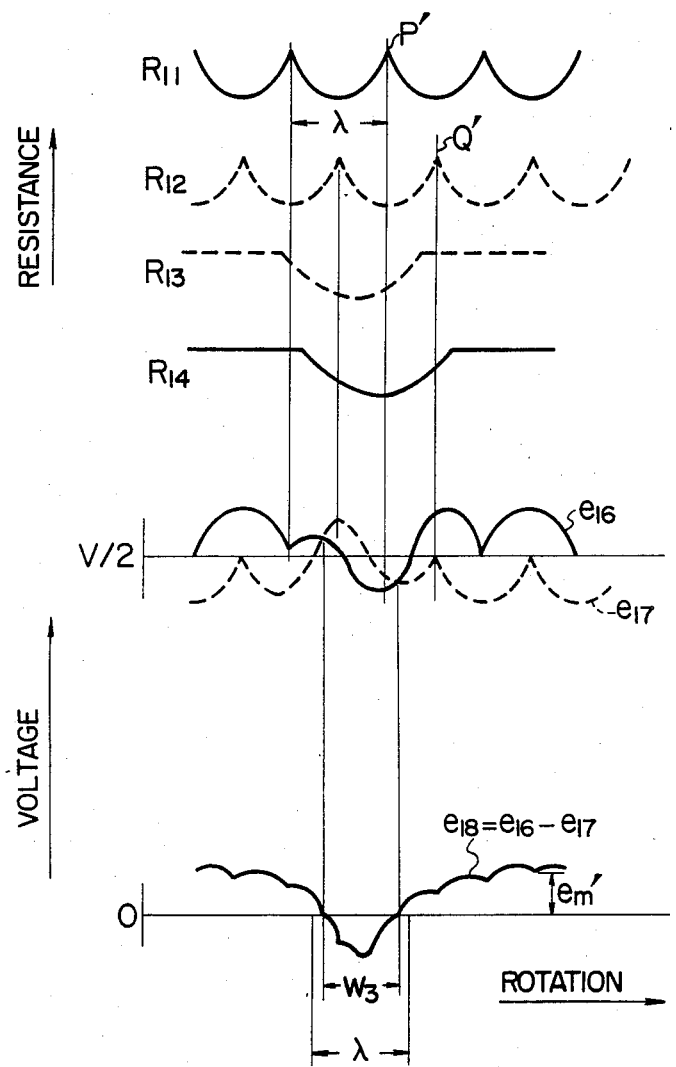

MAGNETIC POSITION SENSOR

The present invention relates to a position sensor and in particular to a magnetic position sensor provided with a reference position of movement.

In general, a magnetic position sensor is composed of a combination of a member having an encoder track comprising a plurality of magnets and a stationary magnetic detector. This member is attached to a desired moving device. As the moving device moves, magnetic lines of force produced by a magnet which moves in face to the stationary detector crossing an encoder element provided on the magnetic detector. This encoder element provided in the magnetic detector detects the amount of the movement of the device in the form of the frequency of change in the electromotive force or electrical resistance.

Japanese Patent Application Laid-Open No. 62875/69 (laid open on May 21, 1979) discloses in addition to the encoder track a reference track using a reference magnetic pole for providing a reference position signal of the above described member.

As for the quality of this reference position signal, the signal width must be sufficiently narrow and the signal amplitude must be large so that one of signals produced by a plurality of magnets in the above described encoder track may be specified as a standard or reference position.

Therefore, an object of the present invention is to provide a magnetic position sensor yielding without increasing the number of tracks a position reference signal which is narrow in width as compared with the encoder signal and is large in amplitude for assuring noise immunity.

In accordance with the present invention, a first and a second magnetic element groups respectively confronting to the reference track and encoder track are provided, said first and second magnetic element groups jointly yielding a reference signal which represents a reference position in movement of the moving member.

In other words, magneto-resistors for detecting the reference position are divided into two sets, one of the two sets being confronted by the encoder track portion of a magnetic substance in the position member and the other of the two sets being confronted by the reference track portion, and these magneto-resistors are configured in a 3-terminal form or bridge connection, thereby the width of the reference position signal is made narrower and the output voltage is raised.

The present invention is best understood by referring to the specification and the following figures, in which FIGS. 1 to 5B show preparatory works by the inventors wherein;

FIG. 1 is a configuration diagram of a disk-shaped rotary sensor;

FIG. 2A is an enlarged arrangement diagram of a magnetic substance in the rotary sensor;

FIG. 2B is an enlarged arrangement diagram of a magnetic detector in the rotary sensor;

FIG. 3 is a schematic developed diagram illustrating an expanded arrangement of the magnetic substance and the magnetic detector;

FIG. 15 is a diagram of waveforms obtained by using the magnetic detector illustrated in FIG. 14.

Figure 4:
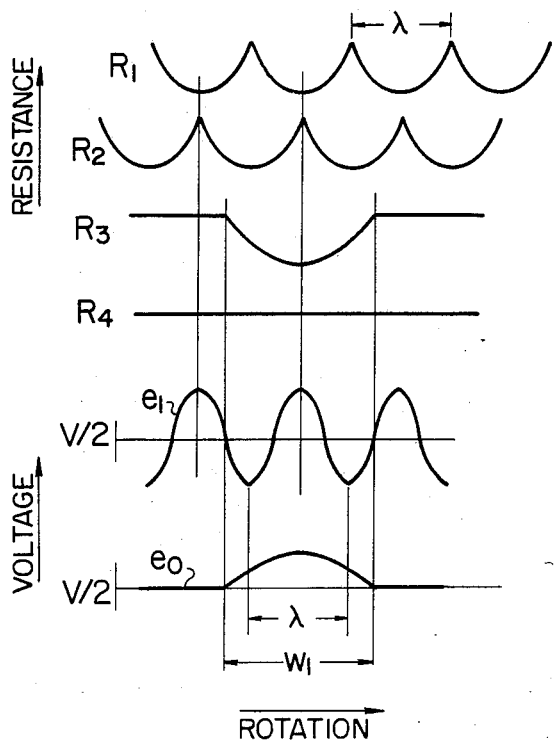
FIG. 4 is a diagram of waveforms obtained by using the arrangement illustrated in FIG. 3 when the rotary sensor is revolved.

FIG. 1 shows a rotary sensor wherein a magnetic signal is written onto a magnetic substance 4 attached to a rotary member 3 which is mounted on a rotary shaft 2 of a rotating device 1 and revolution of the rotating device 1 is detected as change in resistance value of a magneto-resistor included in a magnetic detector 6 which is attached onto a fixing plate 5 and confronted by the magnetic substance 4 through a small gap.

FIG. 2A and FIG. 2B are views of the rotary sensor illustrated in FIG. 1 seen from the rotary shaft direction. Symbols N and S respectively represent an N pole and an S pole of a magnet. These magnets may be replaced by one sheet of magnetic tape which is so magnetized that N poles and S poles may appear alternately. Referring to FIG. 2A, the magnetic detector 6 is composed of an encoding element group 61 for producing signals composed of several ten to several hundred pulses per revolution and a reference element group 62 for producing one reference signal per revolution. In addition, an encoder track 41 composed of a number of magnets and a reference track 42 including one magnet composed of an N pole and an S pole are formed on the magnetic substance 4. And the encoder track 41 confronts to the encoding element group 61 and the reference track 42 confronts to the reference element group 62. FIG. 2B shows a reference track 42a having two magnets.

FIG. 3 is a schematic enlargement diagram illustrating the pole arrangement in the magnetic substance and the magnetic detector illustrated in FIG. 2A or 2B. In FIG. 3, the same symbol used in FIG. 1 or FIG. 2 represents the identical portion. Marks $R_1$ to $R_4$ denote magneto-resistors. Magneto-resistors $R_1$ and $R_2$ confront to the encoder track 41. Magneto-resistors $R_3$ and $R_4$ confront to the reference track 42. Magneto-resistors $R_1$ and $R_2$ are used to obtain an encoder pulse signal. Magneto-resistors $R_3$ and $R_4$ are used to obtain a reference pulse signal.

In the configuration illustrated in FIG. 3, the magnetic substance 4 attached to the rotary member 3 is moved as indicated by an arrow according to the movement of the rotary member 3. The letter $\lambda$ denotes a pitch of the recorded signal in the encoder track 41, i.e., wavelength relating to a distance between an S pole and an N pole.

The resistance value of a magneto-resistor is lowered when either a rightward or leftward magnetic field between N and S poles crossing the magneto-resistor as illustrated by a broken line in FIG. 3 is applied to the magneto-resistor. If the magnetic substance 4 moves in the direction represented by the above described arrow, resistors R's vary as illustrated by the waveforms of FIG. 4. The resistance value is minimized when the magneto-resistor just confronts to a boundary between an S pole and an N pole. Since the magneto-resistor $R_4$ is arranged in parallel to the magnetic field, the resistance value of $R_4$ is not changed. As described later, the magneto-resistor $R_4$ is used as a dummy resistor.

Figure 5A:
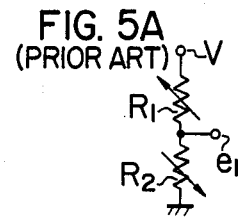
FIG. 5A and FIG. 5B are diagrams of circuits included in the magnetic detector.
Figure 5B:
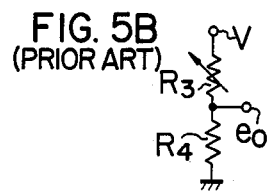

Under such configuration and operation, magneto-resistors $R_1$ and $R_3$ are respectively connected in series with $R_2$ and $R_4$ between the power supply V and the ground as illustrated in circuit diagrams of FIG. 5A and FIG. 5B. From the series connection point for the encoding element group 61, an encoder signal having the waveform $e_1$ with the bias V/2 as illustrated in FIG. 4 is obtained. From the series connection point for the reference element group 62, a reference position signal having the waveform $e_0$ with the bias V/2 as illustrated in FIG. 4 is obtained. As shown in FIG. 4, a width $w_1$ in the waveform of the reference signal $e_0$ is larger than the wavelength $\lambda$ relating to the pitch of the recorded signal on the above described encoder track 41.

This is because the magnetic flux is apt to spread to the outside of the recording portion since only a magnetic signal composed of a pair of S and N poles is recorded on the reference track 42. On the other hand, magnetic signals composed of S and N poles are consecutively recorded on the encoder track 41. Therefore, the magnetic flux is not spread due to attraction between successive magnetic poles. As a result, the width $w_1$ of the reference signal becomes larger than the wavelength width $\lambda$ of the encoder signal.

For the use as a rotary sensor, it is necessary to narrow the reference signal width as far as possible in order to suppress the reference position error and improve accuracy.

The amplitude of the encoder signal output $e_1$ which is defined by magneto-resistors $R_1$ and $R_2$ is large because $R_2$ decreases while $R_1$ is increasing and $R_2$ increases while $R_1$ is decreasing. The output voltage $e_0$ of the reference signal is small as compared with the encoder signal output $e_1$ because of the use of the magneto-resistor $R_4$ as a dummy resistor as shown in FIG. 4. Assuming that the magneto-resistor $R_3$ is varied from its standard value R by 2% in the circuit of FIG. 5B, the output voltage $e_0$ of the reference signal is represented as $$e_0 \propto \frac{R_3}{R_3 + R_4} = \frac{R(1 + 0.02)}{R(1 + 0.02) + R} = \frac{1.02}{2.02} \approx 0.505. \quad (1)$$

That is to say, the variation of the output voltage $e_0$ with respect to the applied voltage is 0.5%.

Figure 6:
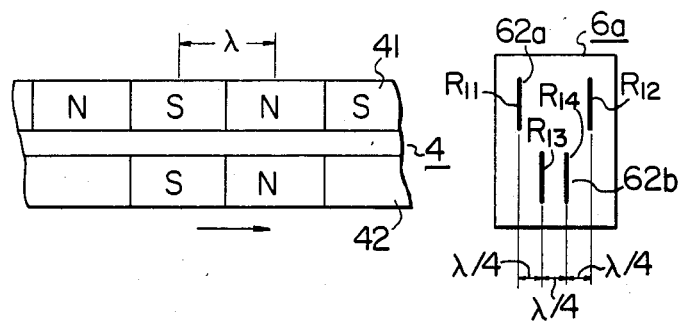
FIG. 6 is a schematic developed diagram illustrating an embodiment of arrangement of the magnetic substance and magnetic detector according to the present invention.

FIG. 6 is a schematic enlargement drawing illustrating another embodiment of the present invention which is different from the embodiment illustrated in FIG. 3. Although magneto-resistors for the encoder signal corresponding to $R_1$ and $R_2$ represented by hollow boxes in FIG. 3 are not illustrated in FIG. 6, they may be configured in the same way as FIG. 3 or arbitrarily. In FIG. 6, symbols found in FIG. 1 to FIG. 3 represent equivalent portions. In addition, numeral 6a denotes a magnetic detector. Numerals 62a and 62b respectively denote a pair composed of magneto-resistors $R_{11}$ and $R_{12}$ and another pair composed of magneto-resistors $R_{13}$ and $R_{14}$. These pairs jointly produce the reference signal representing the reference phase position in revolution. Magneto-resistors $R_{11}$ and $R_{12}$ set at a space of $3\lambda/4$ confronts to the encoder track 41 illustrated in FIG. 6. Magneto-resistors $R_{13}$ and $R_{14}$ set at a space of $\lambda/4$ confronts to the reference track 42. Since the space between $R_{11}$ and $R_{13}$ is $\lambda/4$, the space between $R_{11}$ and $R_{14}$ is $2\lambda/4$. On the encoder track 41 illustrated in FIGS. 2A and 2B, magnetic poles are arranged over its entire periphery at a repetition wavelength $\lambda$. On the reference track, a pair composed of an N pole and an S pole having the same wavelength $\lambda$ as the encoder track 41 is so arranged that the N pole and S pole will be respectively adjacent to one of N poles and one of S poles on the encoder track, i.e., the identical polarity arrangement will be established. Resistance values of magneto-resistors $R_{11}$ to $R_{14}$ are varied as illustrated in FIG. 7 since magnetic fields applied to respective magneto-resistors vary while the magnetic substance 4 is moving in a direction indicated by an arrow in FIG. 6.

Figure 7:
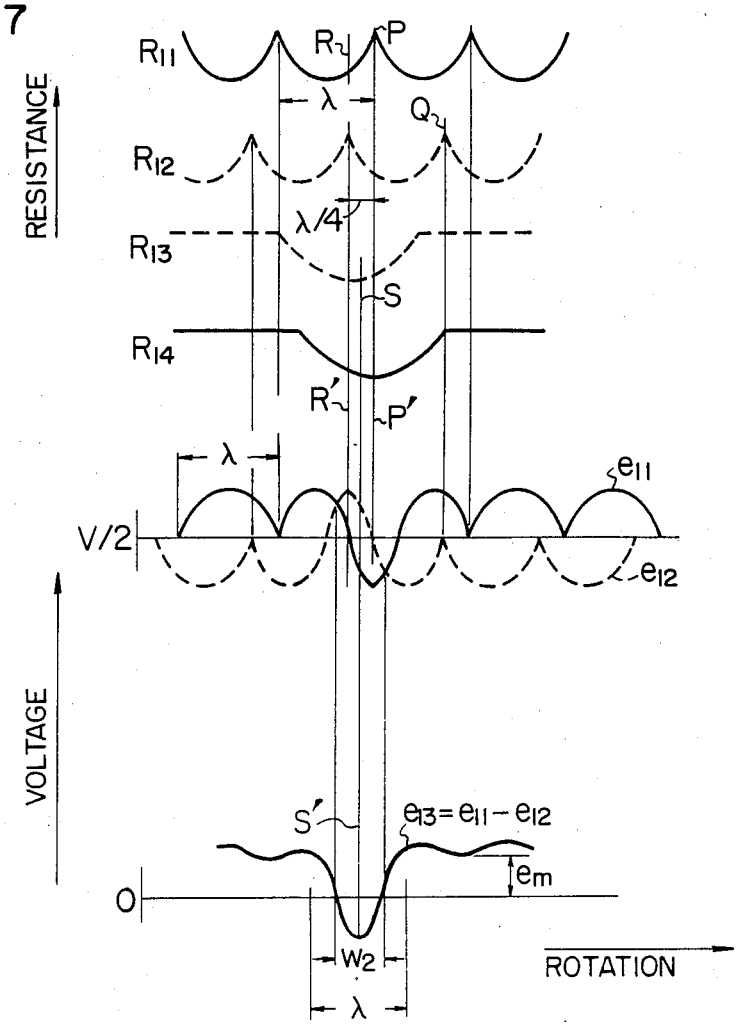
FIG. 7 is a diagram of a waveform which is obtained by using the magnetic detector illustrated in FIG. 6.
Figure 8:
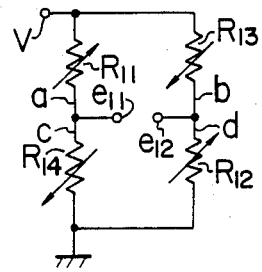
FIG. 8 is a diagram of a circuit included in the magnetic detector illustrated in FIG. 6.
Figure 9:
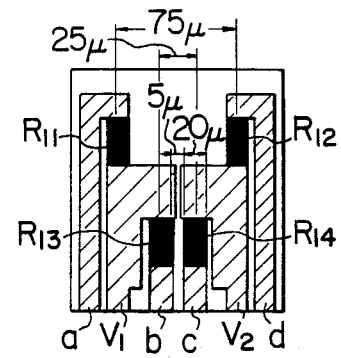
FIG. 9 is a pattern diagram illustrating an actual example of arrangement of the magnetic detector illustrated in FIG. 6.

Due to movement of the magnetic substance 4, the resistance value of $R_{11}$ reaches a peak P as illustrated in FIG. 7. When the magnetic substance 4 further advances by a distance corresponding to $3\lambda/4$, the resistance value of $R_{12}$ reaches its peak Q. In other words, the waveform of $R_{12}$ lags by $3\lambda/4$ in phase as compared with that of $R_{11}$. The difference between the phase of $R_{13}$ and that of $R_{14}$ is $\lambda/4$. These four magneto-resistors are connected in a bridge form as illustrated in FIG. 8. That is to say, serially connected $R_{11}$ and $R_{14}$ are coupled in parallel with serially connected $R_{12}$ and $R_{13}$ to form the bridge circuit. The magneto-resistors $R_{11}$ to $R_{14}$ are obtained by plating permalloy by vapor deposition techniques and then etching it. Actual examples of patterns of $R_{11}$ to $R_{14}$ are illustrated in FIG. 9. In FIG. 9, the wavelength is chosen as $\lambda = 100\mu$. To ends of the bridge circuit illustrated in FIG. 8, a first power supply voltage V and a second power supply voltage such as the ground are connected. A first output voltage $e_{11}$ is taken out from the coupling point between $R_{11}$ and $R_{14}$. A second output voltage $e_{12}$ is taken out from the coupling point between $R_{13}$ and $R_{12}$. Since the resistance values of respective magneto-resistors are nearly equal when magnetic fields are not applied to them, the output voltages $e_{11}$ and $e_{12}$ are both biased to V/2. When the resistance values of magneto-resistors $R_{11}$ to $R_{14}$ are varied due to revolution of the rotary member 3, the above described first and second output voltages vary as represented by curves $e_{11}$ and $e_{12}$ in FIG. 7.

The potential difference between the first output voltage and the second output voltage changes as represented by a curve denoted by $e_{13} = e_{11} - e_{12}$ in FIG. 7. In a span partitioned by two reference lines R—R' and P—P', the values of $R_{11}$ and $R_{12}$ are larger than their respective average values and the values of $R_{13}$ and $R_{14}$ are smaller than their respective average values. Such a situation is represented by arrows added to respective magneto-resistors in FIG. 8. In the above described span, it may be recognized that the value of $e_{11}$ is lower than its average value whereas the value of $e_{12}$ is higher than its average value and the value of $e_{13}$ is extremely lower than its average value. Assuming that the resistance values of respective magneto-resistors vary ±2% due to movement of the magnetic substance 4, the output voltage of the bridge circuit may be represented as $$e_{11} \propto \frac{R_{14}}{R_{11} + R_{14}} = \frac{R(1 - 0.02)}{R(1 + 0.02) + R(1 - 0.02)} \quad (2)$$

and $$e_{12} \propto \frac{R_{12}}{R_{12} + R_{13}} = \frac{R(1 + 0.02)}{R(1 + 0.02) + R(1 - 0.02)} \quad (3)$$

Hence, $$e_{13} = e_{11} - e_{12} \propto \frac{R(-0.04)}{R(2.0)} = -0.02 \quad (4)$$

That is to say, the output voltage $e_{13}$ of the bridge circuit is decreased by 2% with respect to the applied voltage V. The decrease ratio of 2% is larger than the change ratio 0.5% of the voltage $e_0$ as illustrated in FIG. 4. The pulse width $w_2$ of $e_{13}$ is narrower than the pulse width $w_1$ of $e_0$ illustrated in FIG. 4. In addition, $e_{13}$ has the bias voltage of 0 V as illustrated in FIG. 7 whereas $e_0$ is biased to the DC bias voltage of V/2 as illustrated in FIG. 4.

The outputs of magneto-resistors $R_{11}$ and $R_{12}$ mainly contribute to a portion of $e_{13}$ which is above the 0 V - axis and the outputs of magneto-resistors $R_{13}$ and $R_{14}$ mainly contribute to a portion which is below the 0 V - axis. At positions other than the reference position, i.e., on the left and right positions in FIG. 7 excluding the width $w_2$ of the above described difference between the outputs $e_{11}$ and $e_{12}$, the signal from the encoder track 41 produces reverse voltage of $e_m$ having a polarity which is opposite to that of the reference position signal. As a result, resolution of the reference position signal is improved and the external noise immunity is enhanced. Thus, the probability of false operation is lowered. Instead of the spacing $\lambda/4$ between the magneto-resistors $R_{13}$ and $R_{14}$, a spacing not exceeding $\lambda/2$ may be adopted. However, a spacing exceeding $\lambda/2$ is not desirable since the pulse height of the output $e_{13}$ is lowered. In the arrangement of magneto-resistors illustrated in FIG. 6, $R_{11}$ is $\lambda/4$ apart from $R_{13}$ and $3\lambda/4$ apart from $R_{12}$. It is also permitted to displace $R_{11}$ to the left by $\lambda$ so that $R_{11}$ will be $5\lambda/4$ from $R_{13}$ and $7\lambda/4$ from $R_{12}$. It is also permissible to displace $R_{11}$ to the left by $2\lambda$ so that $R_{11}$ will be $9\lambda/4$ apart from $R_{13}$ and $11\lambda/4$ apart from $R_{12}$. In general, the position of $R_{11}$ may be chosen with respect to $R_{13}$ as $(\frac{1}{4}+n/2)\lambda$ where n is 0 or an integer. Also, the position of $R_{11}$ may be chosen with respect to $R_{12}$ as $(\frac{3}{4}+n)\lambda$ where n is 0 or an integer.

Figure 10:
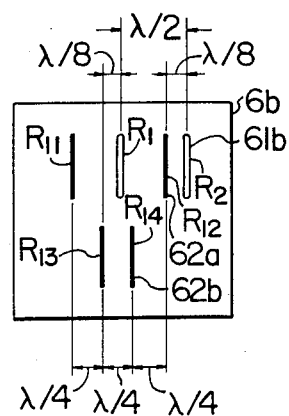
FIG. 10 is a diagram of an internal configuration of another embodiment of a magnetic detector according to the present invention.

FIG. 10 shows the schematic configuration of a magnetic detector in another embodiment of a rotary sensor according to the present invention.

In FIG. 10, a symbol already used in FIG. 6 denotes the identical portion. Numeral 6b denotes a magnetic detector and numeral 61b represented by a hollow box denotes an encoding element group for yielding an encoder signal. $R_1$ and $R_2$ denote magneto-resistors of the encoder section 61b.

That is to say, the rotary sensor according to this embodiment is configured by using a magnetic detector 6b instead of the magnetic detector 6a illustrated in FIG. 6. The magnetic substance 4 is not illustrated since it is the same as the magnetic substance 4 illustrated in FIG. 6.

Magneto-resistors $R_{11}$, $R_{12}$, $R_{13}$ and $R_{14}$ are arranged in the same way as FIG. 6.

Magneto-resistors $R_1$ and $R_2$ of the encoding element group 61b are arranged $\lambda/2$ from each other as illustrated in FIG. 10. The magneto-resistor $R_1$ is displaced from the magneto-resistor $R_{13}$ for detecting the reference position by $\lambda/8$ and the magneto-resistor $R_2$ is displaced from the magneto-resistor $R_{12}$ by $\lambda/8$ as illustrated in FIG. 10. And the magneto-resistors $R_1$ and $R_2$ are so arranged as to confront to the encoder track 41.

Figure 11A:
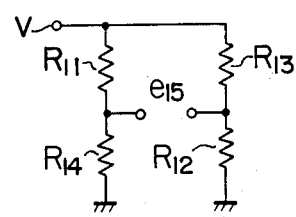
FIG. 11A and FIG. 11B are a diagrams of circuits in the magnetic detector illustrated in FIG. 10.
Figure 11B:
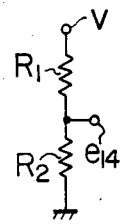

Under such an arrangement, the magneto-resistors $R_{11}$ and $R_{13}$ are respectively connected in series with $R_{14}$ and $R_{12}$ to form a resistance bridge as illustrated in FIG. 11A. The difference between $e_{11}$ and $e_{12}$ is used as the reference signal output voltage $e_{15}$. In addition, the magneto-resistors $R_1$ and $R_2$ are serially connected as illustrated in FIG. 11B to yield an encoder signal output $e_{14}$.

Figure 12:
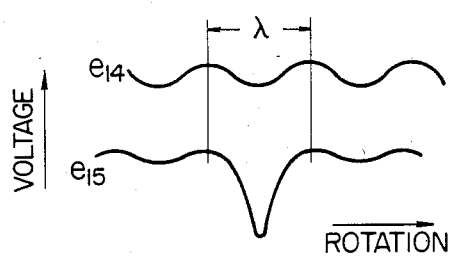
FIG. 12 is a diagram of waveforms obtained by using the magnetic detector illustrated in FIG. 10.

The relationship between $e_{14}$ and $e_{15}$ is illustrated by waveforms in FIG. 12. The encoder signal $e_{14}$ may be coincident in phase with the reference position signal $e_{15}$. This coincidence may be explained as follows.

Referring to FIG. 7, an intermediate position between the respective lowest points of waveforms $R_{13}$ and $R_{14}$ defines the position S—S' of the lowest point in the waveform $e_{13}$. Therefore, it is understood that the minimum value of the encoder signal may be attained at the position S—S' by placing $R_1$ which is one of two magneto-resistors for yielding the encoder signal at an intermediate position between $R_{13}$ and $R_{14}$ as illustrated in FIG. 10.

According to the above described embodiment, it becomes unnecessary to shift the relative position of the reference track with respect to the encoder track for phase alignment.

If the above described phase alignment is attempted by shifting the relative position of the reference track with respect to the encoding track when recording a signal on the magnetic substance 4 illustrated in FIG. 6, leakage of magnetic flux from the encoding element group onto the reference element group is brought about. It is not permitted to change the positional relationship, or coincident phase relationship between S-N pairs in tracks 41 and 42.

Unless the identical wavelength $\lambda$ is used for recorded signals in both the encoding element group and the reference element group as described before for the embodiment illustrated in FIG. 6, leakage of magnetic flux is similarly incurred.

Figure 13:
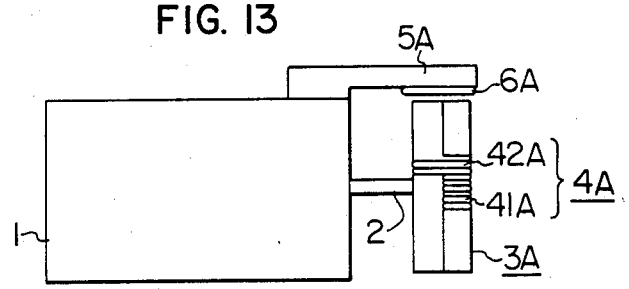
FIG. 13 is a diagram of a configuration of another embodiment of a drum-shaped rotary sensor according to the present invention.

Whereas FIG. 6 and FIG. 10 pertain to a rotary sensor wherein the rotary member having the magnetic substance is disk-shaped, FIG. 13 shows schematic configuration of an embodiment of a drum-type rotary sensor having a drum-shaped rotary member according to the present invention.

In FIG. 13, numeral 1 denotes a rotating device and numeral 2 denotes a rotary shaft. Numerals 3A, 4A, 5A and 6A denote a drum-shaped rotary member, a magnetic substance, a fixing plate and a magnetic detector, respectively. A numeral 41A denotes an encoder track and 42A denotes a reference track.

Magneto resistors on the magnetic detector 6A are arranged relative to the magnetic substance 4A in the same way as the embodiment illustrated in FIG. 6 or FIG. 10. Accordingly, an equivalent effect may be expected.

Figure 14:
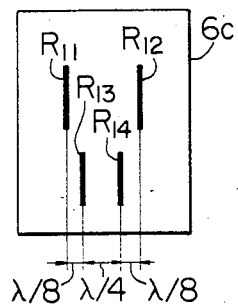
FIG. 14 is diagram of a configuration of another embodiment of a magnetic detector according to the present invention.

FIG. 14 shows the schematic configuration of another embodiment of a magnetic detector according to the present invention. The magnetic detector is denoted by 6c. Four magneto-resistors are denoted by the same symbols as those in FIG. 6. As compared with the arrangement illustrated in FIG. 6, magneto-resistors $R_{11}$ and $R_{12}$ illustrated in FIG. 14 are so displaced as to approach each other respectively by $\lambda/8$. These four magneto-resistors are connected in the same way as FIG. 8.

FIG. 15 shows waveforms produced by the arrangement of magneto-resistors illustrated in FIG. 14 due to movement of the magnetic substance 4 illustrated in FIG. 6. Points P' and Q' illustrated in FIG. 15 corresponding to the points P and Q illustrated in FIG. 7 approach each other so that they will be at a distance of $\lambda/2$. An output voltage waveform $e_{17}$ is derived from waveforms of magneto-resistors $R_{12}$ and $R_{13}$. An output voltage waveform $e_{16}$ is derived from waveforms of magneto-resistors $R_{11}$ and $R_{14}$. These waveforms $e_{17}$ and $e_{16}$ respectively correspond to the waveforms $e_{12}$ and $e_{11}$ illustrated in FIG. 7. Accordingly, the output voltage of the bridge circuit composed of $R_{11}$ to $R_{14}$ has a waveform represented as $e_{18}=e_{16}-e_{17}$ in FIG. 15. The waveform of $e_{18}$ has a pulse width $w_3$ which is slightly wider than the pulse width $w_2$ of the reference signal in the waveform $e_{13}$ illustrated in FIG. 7. The reverse bias voltage $e_m'$ of the waveform $e_{18}$ is slightly larger than the reverse bias voltage $e_m$ of the waveform $e_{13}$. The above described displacement of $R_{11}$ and $R_{12}$ by $\lambda/8$ means displacement of $(\frac{1}{4}+n/2)\lambda$ expressed before in (5) by approximately $\lambda/8$. This permissible tolerance of a magneto-resistor is useful in fabrication. This embodiment is also effective for the shift of a magneto-resistor by $\lambda/8$ or less.

Further, the spacing between $R_{13}$ and $R_{14}$ may be an arbitrary value not exceeding $\lambda/2$ as described before.

Further, the magneto-resisters used in the embodiment of the invention may be substituted for other magnetic elements such as Hall effect elements.

The above embodiments are related to a magnetic rotary sensor having a rotary member and a magnetic detector. According to other embodiments of the invention, a magnetic position sensor having a member moving in a linear direction and a magnetic detector may be provided. In this case, a pair of magnets are provided on a reference track of a linear member. As the linear member moves at the detector, the magnetic detectors provide voltage signals shown in FIG. 7 in the same manner as already mentioned.

We claim:

1. A magnetic position sensor comprising:
    a moving member having an encoder track and a reference track, said encoder track being composed of consecutive N poles and S poles arranged alternately on said moving member, and said reference track being adjacent to said encoder track and including at least one pair of N and S poles arranged on said moving member;
    a first magnetic detector having a first pair of magnetic pickup means which is close to and confronts with said reference track and a second pair of magnetic pickup means which is close to and confronts with said encoder track, said first and second pairs of magnetic pickup means including means for jointly producing a reference signal as said moving member moves; and
    a second magnetic detector having a third pair of magnetic pickup means which is close to and confronts with said encoder track, said second magnetic detector producing an encoder signal based on said consecutive N poles and S poles as said moving member moves so as to detect the movement position of said moving member according to said reference signal.

2. A magnetic position sensor according to claim 1, wherein the distance along the moving direction of said moving member from one of said first pair of magnetic pickup means to a closest one of said second pair of magnetic pickup means is approximately $(\frac{1}{4}+N/2)\lambda$ assuming that the repetition spacing of said N poles and S poles is $\lambda$ and N is zero or an integer.

3. A magnetic position sensor according to claim 2, wherein said second pair of magnetic pickup means has first and second magneto-resistors set a predetermined spacing apart, said first pair of magnetic pickup means has third and fourth magneto-resistors set no greater than $\lambda/2$ apart, and said third pair of magnetic pickup means has fifth and sixth magneto-resistors set approximately $(\frac{1}{2}+L)\lambda$ apart where L is zero or an integer.

4. A magnetic position sensor according to claim 1, wherein said first, second and third magnetic pairs of pickup means are composed of Hall effect devices.

5. A magnetic position sensor according to claim 3, wherein a first series circuit formed by connecting said first and fourth magneto-resistors in series via a first coupling point and a second series circuit formed by connecting said second and third magneto-resistors in series via a second coupling point are connected in parallel with a terminal of said first magneto-resistor coupled to a terminal of said third magneto-resistor and a terminal of said second magneto-resistor coupled to a terminal of said fourth magneto-resistor for forming a parallel circuit, a DC voltage being applied across said parallel circuit, and said reference signal being taken out from said first and second coupling points.

6. A magnetic position sensor according to claim 1, wherein an N pole and an S pole arranged on said reference track are respectively adjacent to an N pole and a neighboring S pole arranged on said encoder track which is contiguous to said reference track, and an identical pitch between an N pole and an S pole applies to both of said reference track and said encoder track.

7. A magnetic position sensor according to claim 3, wherein a space between said third and fourth magneto-resistors is approximately $\lambda/4$.

8. A magnetic position sensor according to claim 3, wherein a space between one magneto-resistor of said second pair of magnetic pickup means and a closest magneto-resistor of said third pair of magnetic pickup means is approximately $(\frac{1}{8}+K/2)\lambda$ where K is zero or an integer.

9. A magnetic position sensor comprising:
    an encoder track composed of consecutive N poles and S poles arranged on a moving member;
    a reference track arranged adjacent to said encoder track, said reference track comprising a pair of N pole and S pole on the circumference thereof;
    a magnetic detector for receiving magnetic fields which vary as said moving member moves from said encoder track as well as said reference track and for yielding a reference signal voltage which defines a position;
    first and second magnetic pickup elements arranged on said magnetic detector so as to confront with said encoder track, said first and second magnetic pickup elements being placed at a space which is approximately half of a repetition pitch of N poles and S poles on said encoder track;

third and fourth magnetic pickup elements arranged on said magnetic detector so as to confront with said reference track, said third and fourth magnetic pickup elements being placed at a space which is approximately a quarter of said repetition pitch; and means for yielding an output which is the difference between a first output obtained by adding outputs of said first and fourth magnetic pickup elements and a second output obtained by adding outputs of said second and third magnetic pickup elements.

10. A magnetic rotary sensor comprising:

a rotary member having a rotary encoder track and a reference track, said rotary encoder track being composed of consecutive N poles and S poles arranged alternately on the circumference of said rotary member, and said reference track being adjacent to said rotary encoder track and including at least one pair of N and S poles arranged on the circumference of said rotary member;

a first magnetic detector having a first pair of magnetic pickup means which is close to and confronts with said reference track and a second pair of magnetic pickup means which is close to and confronts with said rotary encoder track, said first and second pairs of magnetic pickup means includes means for jointly producing a reference signal as said rotary member revolves; and a second magnetic detector having a third pair of magnetic pickup means which is close to and confronts with said rotary encoder track, said second magnetic detector producing an encoder signal based on said consecutive N poles and S poles as said rotary member revolves so as to detect the revolutional angle of said rotary member according to said reference signal.

11. A magnetic rotary sensor according to claim 10, wherein the distance along the revolution direction of said rotary member from one of said first pair of magnetic pickup means to a closest one of said second pair of magnetic pickup means is approximately $(\frac{1}{4}+N/2)\lambda$ assuming that the repetition spacing of said N poles and S poles is $\lambda$ and N is zero or an integer.

12. A magnetic rotary sensor according to claim 11, wherein said second pair of magnetic pickup means has first and second magneto-resistors set a predetermined spacing apart, said first pair of magnetic pickup means has third and fourth magneto-resistors set no greater than $\lambda/2$ or less apart, and said third pair of magnetic pickup means has fifth and sixth magneto-resistors set approximately $(\frac{1}{2}+L)\lambda$ apart where L is zero or an integer.

13. A magnetic rotary sensor according to claim 10, wherein said first, second and third pairs of magnetic pickup means are composed of Hall effect devices.

14. A magnetic rotary sensor according to claim 12, wherein a first series circuit formed by connecting said first and fourth magneto-resistors in series via a first coupling point and a second series circuit formed by connecting said second and third magneto-resistors in series via a second coupling point are connected in parallel with a terminal of said first magneto-resistor coupled to a terminal of said third magneto-resistor and a terminal of said second magneto-resistor coupled to a terminal of said fourth magneto-resistor for forming a parallel circuit, a DC voltage being applied across said parallel circuit, and said reference signal being taken out from said first and second coupling points.

15. A magnetic rotary sensor according to claim 10, wherein an N pole and an S pole arranged on said reference track are respectively adjacent to an N pole and a neighboring S pole arranged on said rotary encoder track which is contiguous to said reference track, and an identical pitch between an N pole and an S pole applies to both of said reference track and said rotary encoder track.

16. A magnetic rotary sensor according to claim 12, wherein a space between said third and fourth magneto-resistors is approximately $\lambda/4$.

17. A magnetic rotary sensor according to claim 12, wherein a space between one magneto-resistor of said second pair of magnetic pickup means and closest magneto-resistor of said third pair of magnetic pickup means is approximately $(\frac{1}{4}+K/2)\lambda$ where K is zero or an integer.

18. A magnetic rotary sensor comprising:

a rotary encoder track composed of consecutive N poles and S poles arranged alternately over the entire circumference of a rotary member;

a reference track arranged adjacent to said rotary encoder track, said reference track comprising a pair of N pole and S pole on the circumference thereof;

a magnetic detector for receiving magnetic fields which vary as said rotary member revolves from said rotary encoder track as well as said reference track and for yielding a reference signal voltage which defines a revolution phase position;

first and second magnetic pickup elements arranged on said magnetic detector so as to confront with said rotary encoder track, said first and second magnetic pickup elements being placed at a space which is approximately half of a repetition pitch of N poles and S poles on said rotary encoder track;

third and fourth magnetic pickup elements arranged on said magnetic detector so as to confront with said reference track, said third and fourth magnetic pickup elements being placed at a space which is approximately a quarter of said repetition pitch; and means for yielding an output which is the difference between a first output obtained by adding outputs of said first and fourth magnetic pickup elements and a second output obtained by adding outputs of said second and third magnetic pickup elements.

19. A magnetic position sensor according to claim 7, wherein the predetermined spacing between said first and second magneto-resistors is approximately $(\frac{3}{4}+M)\lambda$ where M is zero or an integer.

20. A magnetic rotary sensor according to claim 16, wherein the predetermined spacing between said first and second magneto-resistors is approximately $(\frac{3}{4}+M)\lambda$ where M is zero or an integer.

* * * * *